US 6,613,630 B2

(12) United States Patent
Lee (10) Patent No.: US 6,613,630 B2
(45) Date of Patent: Sep. 2, 2003

(54) NONVOLATILE MEMORY DEVICE AND FABRICATING METHOD THEREOF

(75) Inventor: Da Soon Lee, Chungcheongbuk-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 0 days.

(21) Appl. No.: 10/278,422

(22) Filed: Oct. 23, 2002

(65) Prior Publication Data

US 2003/0080373 A1 May 1, 2003

(30) Foreign Application Priority Data

Oct. 30, 2001 (KR) .................................... 2001-0067091

(51) Int. Cl.$^7$ ......................................... H01L 21/8247
(52) U.S. Cl. ...................................... 438/257; 438/593
(58) Field of Search .............................. 438/257–267, 438/593–594

(56) References Cited

U.S. PATENT DOCUMENTS

| 5,923,976 | A | * | 7/1999 | Kim ............................ 438/261 |
| 6,060,741 | A | * | 5/2000 | Huang ......................... 257/315 |
| 6,399,444 | B1 | * | 6/2002 | Cappelletti ................... 438/260 |
| 2003/0045082 | A1 | * | 3/2003 | Eldridge et al. ............. 438/593 |

* cited by examiner

Primary Examiner—Richard Booth
(74) Attorney, Agent, or Firm—Ladas & Parry (57) ABSTRACT

A nonvolatile memory device includes two metal layers, which act respectively as a floating gate and a control gate, and each of which has a downwardly extended portion. Thereby, a surface area per fixed unit cell area is increased, or alternatively a unit cell area per fixed surface area is reduced. Therefore, the nonvolatile memory device has enhanced programming and erasing properties and also improved reliability. Furthermore, a method for forming the nonvolatile memory device is provided with simplified processes.

11 Claims, 6 Drawing Sheets

FIG. 1

(PRIOR ART)

NONVOLATILE MEMORY DEVICE AND FABRICATING METHOD THEREOF

BACKGROUND OF THE INVENTION

1. Field of the Invention

The present invention relates generally to a nonvolatile memory device and a method for fabricating the device, and more particularly, to a flash memory device having a floating gate and a control gate formed of a metal layer having a downwardly extended portion so as to enhance programming and erasing properties thereof and improve reliability thereof, and a related fabrication method.

2. Description of the Prior Art

As generally known in the art, a nonvolatile memory device is contrasted with a volatile memory device such as a dynamic random access memory (DRAM) and a static random access memory (SRAM). The nonvolatile memory device includes an erasable programmable read only memory (EPROM), an electrically EPROM (EEPROM) and a flash EEPROM.

The nonvolatile memory device has advantages that stored data can be retained even in power off, user can erase the stored data, and programming can be made by user. In particular, the flash EEPROM is a desirable nonvolatile memory device having the advantage of low price in the EPROM and that of convenience in the EEPROM. In the flash EEPROM, the programming operation and the erasing operation are performed by means of hot electron injection and tunneling, respectively.

Figure 1:
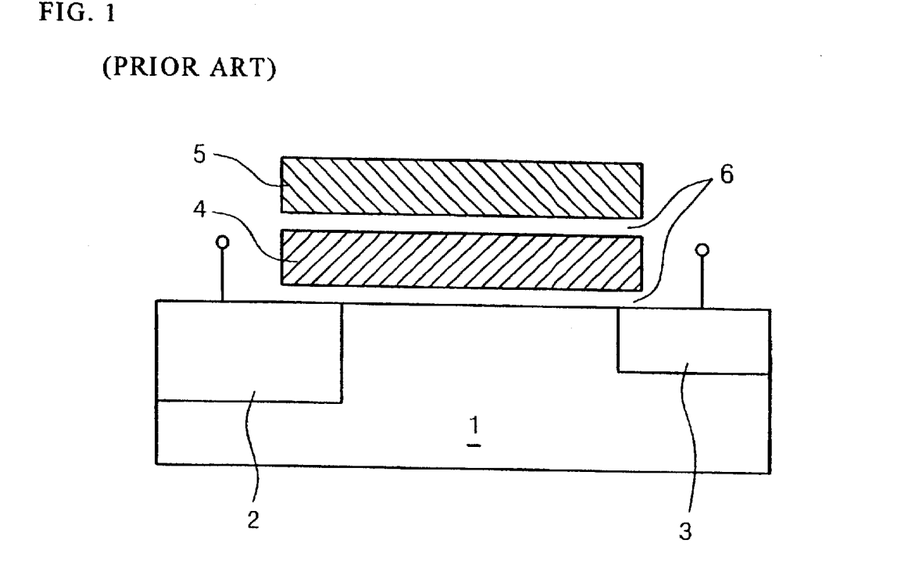
FIG. 1 is a cross-sectional view schematically showing a conventional nonvolatile memory device.

A conventional nonvolatile memory device will be described in the following. FIG. 1 schematically shows a conventional flash EEPROM.

Referring to FIG. 1, a source region 2 and a drain region 3 are formed with a predetermined distance in a semiconductor substrate 1. A floating gate 4 and a control gate 5 are formed between the source/drain regions 2 and 3 on the semiconductor substrate 1. The floating gate 4 is surrounded with an oxide layer 6, thereby having a floating shape between the semiconductor substrate 1 and the control gate 5 as indicated by the name itself. Both the floating gate 4 and the control gate 5 are formed of a polysilicon layer.

The conventional nonvolatile memory device shown in FIG. 1 has the deep source region 2 and the shallow drain region 3. A part of the oxide layer 6, interposed between a floating gate 4 and a device channel region to be produced near a surface of the substrate 1, acts as a tunneling oxide layer.

To perform the programming operation, a voltage is applied to both the control gate 5 and the drain region 3, and also the source region 2 is grounded. When a voltage is applied, parts of electrons in the channel region obtain sufficient energies to jump over an energy barrier of an interface between the channel region and the tunneling oxide layer. The electrons are therefore injected into the tunneling oxide layer, and then gather in the floating gate 4 by means of a voltage applied to the control gate 5.

The erasing operation is carried out by Fowler-Nordheim tunneling phenomenon appearing when a voltage is applied to both the control gate 5 and the source region 2. If a low voltage is applied to the control gate 5 and a high voltage to the source region 2, electrons of the floating gate 4 flow into the source region 2 through the energy barrier.

Unfortunately, the conventional nonvolatile memory device as described above has generally poor programming and erasing efficiency. Furthermore, since the fabrication of the conventional nonvolatile memory device requires processes for forming two polysilicon layers, that is, the floating gate 4 and the control gate 5, the fabrication method is quite complicate. Additionally, the conventional nonvolatile memory device has a low reliability such as over-erase phenomenon in operation.

SUMMARY OF THE INVENTION

It is therefore an object of the present invention to provide a nonvolatile memory device having enhanced programming and erasing properties and improved reliability.

Another object of the present invention is to provide a method for fabricating a nonvolatile memory device in simplified processes.

In order to accomplish the above and other objects, the present invention provides a nonvolatile memory device including two metal layers, which act respectively as a floating gate and a control gate, and each of which has a downwardly extended portion increasing a surface area per fixed unit cell area or alternatively reducing a unit cell area per fixed surface area.

The nonvolatile memory device according to the present invention includes a semiconductor substrate which has an active area defined by an isolation layer, source and drain regions formed at a distance from each other in the active area, and a gate oxide layer formed on the active area. The nonvolatile memory device further includes a polysilicon layer, which is formed on the gate oxide layer between the source and drain regions, and which acts as a floating gate. The device also includes a first oxide layer, which is formed on the gate oxide layer around the polysilicon layer and on a peripheral part of the polysilicon layer. Furthermore, the device includes a first metal layer, which is formed on a part of the first oxide layer, and which is downwardly extended on a central part of the polysilicon layer exposed through the first oxide layer. Therefore, the first metal layer has a downwardly extended portion electrically connected to the polysilicon layer and thus acts as the floating gate. The device further includes a second oxide layer, which is conformally formed on the first metal layer and the first oxide layer, a second metal layer, which is formed on a part of the second oxide layer so as to correspond to the first metal layer. Therefore, the second metal layer acts as a control gate and has a downwardly extended portion. And, the device further includes metal lines, which are respectively connected to the second metal layer and the source and drain regions.

According to another aspect of the present invention, a method for fabricating a nonvolatile memory device is provided. The method includes providing a semiconductor substrate having an active area defined by an isolation layer, forming a gate oxide layer on the active area, and forming a polysilicon layer acting as a floating gate on a part of the gate oxide layer. The method of the invention further includes forming source and drain regions in the active area from both sides of the polysilicon layer, and forming a first oxide layer on the gate oxide layer around the polysilicon layer and on a peripheral part of the polysilicon layer. The method also includes forming a first metal on a part of the first oxide layer and on a central part of the polysilicon layer exposed through the first oxide layer. Therefore, the first metal layer has a downwardly extended portion electrically connected to the polysilicon layer and thus acts as the floating gate. Furthermore, the method includes forming conformally a second oxide layer on the first metal layer and the first oxide layer, and forming a second metal layer acting as a control gate on a part of the second oxide layer so as to correspond to the first metal layer. Therefore, the second metal layer has a downwardly extended portion. And, the method further includes forming metal lines respectively connected to the second metal layer and the source/drain regions.

DETAILED DESCRIPTION OF THE INVENTION

The present invention will be now described more fully hereinafter with reference to accompanying drawings, in which preferred embodiments of the invention are shown. This invention may, however, be embodied in many different forms and should not be construed as limited to the embodiments set forth herein.

Figure 2:
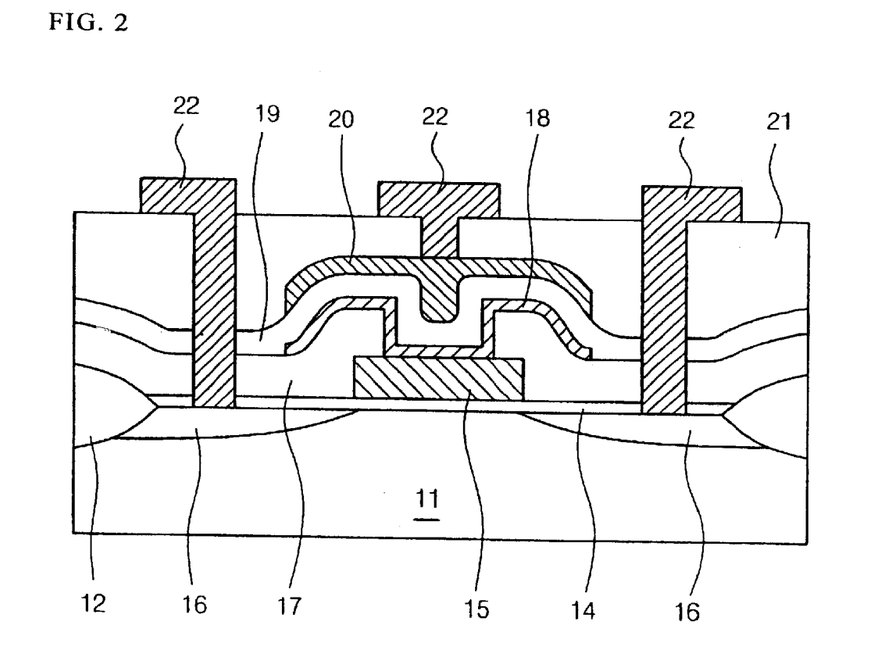
FIG. 2 is a cross-sectional view showing a nonvolatile memory device according to an embodiment of the present invention.

FIG. 2 is a cross-sectional view showing a nonvolatile memory device according to an embodiment of the present invention. Referring to FIG. 2 showing the nonvolatile memory device 10, a semiconductor substrate 11 has an active area defined between adjacent isolation layers 12, and source/drain regions 16 are formed with a lateral distance in the active area of the semiconductor substrate 11. A gate oxide layer 14 is formed on the active area, and a polysilicon layer 15 and a first metal layer 18 both acting as a floating gate are stacked on the gate oxide layer 14 between the source/drain regions 16. A first oxide layer 17 is interposed between the polysilicon layer 15 and the first metal layer 18 electrically connected to each other.

A second metal layer 20 acting as a control gate is formed on the first metal layer 18. A second oxide layer 19 is formed as a tunneling oxide layer between the first and second metal layers 18 and 20, so that the metal layers 18 and 20 are electrically isolated from each other. An interlayer dielectric layer 21 is formed on a resultant structure, and also metal lines 22 are connected to the source/drain regions 16 and the control gate 20, respectively.

The nonvolatile memory device 10 is different from the conventional device in structure, as follows. The floating gate is composed of two layers, that is, the polysilicon layer 15 and the first metal layer 18. In particular, the first metal layer 18 has a downwardly extended portion. Similarly, the second metal layer 20 forming the control gate has also a downwardly extended portion of a lower surface toward the first metal layer 18. Therefore, the second oxide layer 19, interposed between the first and second metal layers 18 and 20, has also a downwardly extended portion. As a result, the area in confronting surfaces of the metal layers 18 and 20 is increased per unit cell area, and thereby the coupling ratio is increased and the programming/erasing properties are improved.

According to the present invention, the tunneling oxide layer is not the gate oxide layer 14, but the second oxide layer 19 interposed between the metal layers 18 and 20. Therefore, while the programming operation is performed in a similar way to that of conventional device, the erasing operation is performed in a different way.

The programming operation requires applying a relatively higher voltage to the control gate 20 and a relatively lower voltage to one of the source/drain regions 16, and also grounding the other of the source/drain regions 16. When a voltage is applied, parts of electrons in a channel region produced near a surface of the substrate 11 obtain sufficient energies to jump over an energy barrier of an interface between the channel region and the gate oxide layer 14. The electrons are therefore injected into the gate oxide layer 14, and then gather in the floating gate 15 and 18 by means of a voltage applied to the control gate 20.

On the other hand, the erasing operation is realized by applying a voltage only to the control gate 20. When a voltage is applied to the control gate 20, electrons in the floating gate 15 and 18 penetrate the energy barrier of the tunneling oxide layer 19 and then flow into the control gate 20. Therefore, the programming/erasing properties are enhanced and thereby the over-erase phenomenon is improved.

Hereinafter, a method for fabricating the nonvolatile memory device depicted in FIG. 2 will be described referring to FIGS. 3A to 3K.

Figure 3A:
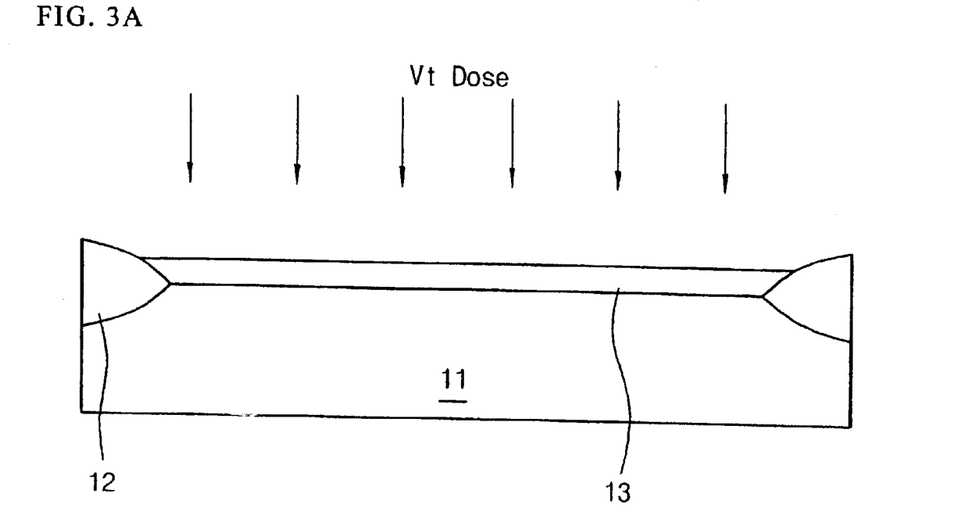
FIGS. 3A to 3K are cross-sectional views sequentially showing a method for fabricating a nonvolatile memory device according to an embodiment of the present invention.

As shown in FIG. 3A, the isolation layer 12 is formed in a predetermined portion of the semiconductor substrate 11 such as a silicon substrate. A sacrificial oxide layer 13 is then formed on a top surface of the substrate 11 between the adjacent isolation layers 12. The substrate 11 has the active area in which cells of the device are formed and an inactive area by which the cells are isolated, wherein the isolation layer 12 is formed in the inactive area. The isolation region 12 is formed by means of well-known local oxidation or trench isolation technique. The sacrificial oxide layer 13 is formed by well-known thermal oxidation process.

Subsequently, proper ions are implanted into the top surface of the substrate 11 with the sacrificial oxide layer 13 employed as a buffer layer. The implanted ions, for example, boron (B), boron difluoride ($BF_2$), arsenic (As), indium (In) or antimony (Sb), serve to control a threshold voltage (Vt).

Figure 3B:
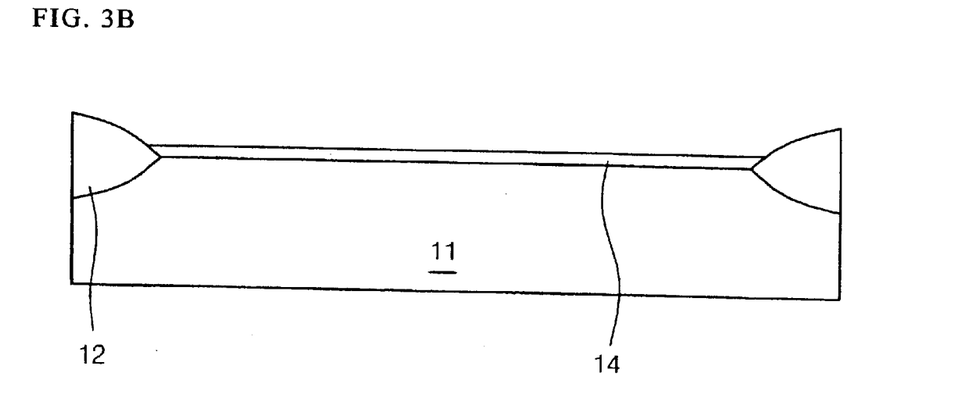

Next, referring to FIG. 3B, the sacrificial oxide layer is removed, and the gate oxide layer 14 is formed on the top surface of the substrate 11. The gate oxide layer 14 is formed with a thickness of about 50~200Å by the thermal oxidation process. Contrary to the conventional device, the gate oxide layer 14 is not employed as a tunneling oxide layer, but employed as a channel oxide layer to which hot electrons are injected in the programming operation.

Figure 3C:
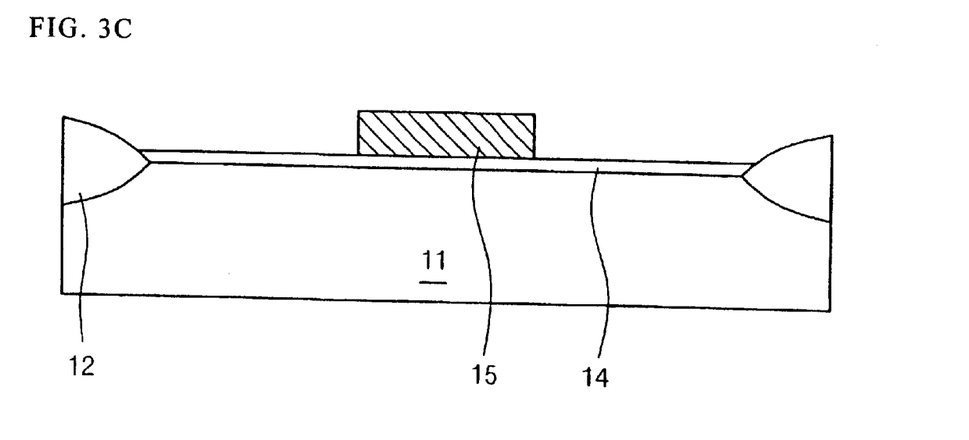

Next, as illustrated in FIG. 3C, the polysilicon layer 15 is deposited on the gate oxide layer 14 and patterned to form the floating gate. The polysilicon layer 15 is formed of polysilicon doped with boron (B) or phosphorus (P). Well-known chemical vapor deposition (CVD) process is used for depositing the polysilicon layer 15, and well-known photo-lithography and subsequent dry etching process is used for patterning. The polysilicon layer 15 has a thickness of about 500~2000Å.

Figure 3D:
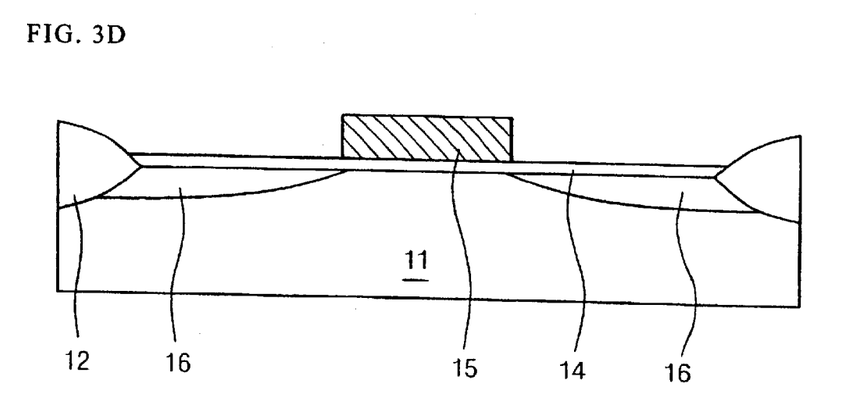

Next, as shown in FIG. 3D, the source/drain regions 16 are formed in a part of the substrate 11 from both sides of the patterned polysilicon layer 15 by using well-known ion implantation and subsequent heat treatment process. For example, ions such as phosphorus (P) or arsenic (As) are implanted with an energy of 10 KeV and dose of 1E15atoms/cm$^2$, and then annealed at a temperature of about 1000° C. for about 10~20 seconds.

Figure 3E:
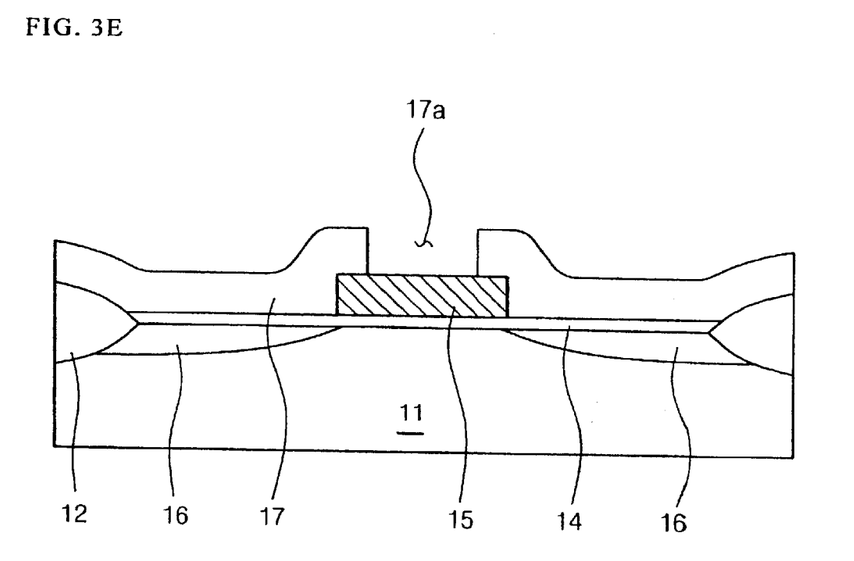

Thereafter, referring to FIG. 3E, the first oxide layer 17 is deposited on the entire resultant structure, and then a hole 17a is formed in the first oxide layer 17 in order to expose a part of an upper surface of the polysilicon layer 15. The first oxide layer 17 is formed to a thickness of several hundreds angstrom (Å) by using well-known CVD process. The hole 17a is formed by well-known photolithography and subsequent dry or wet etch process.

Figure 3F:
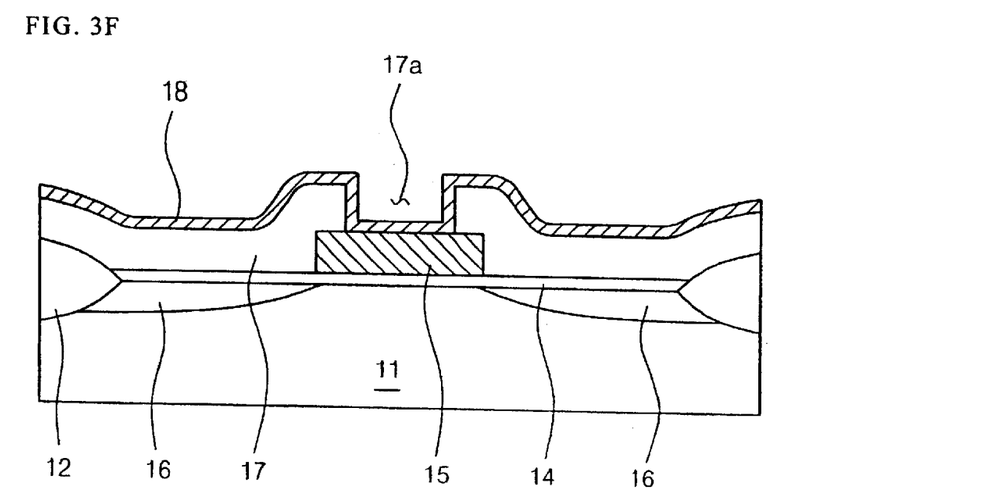

Next, as depicted in FIG. 3F, the first metal layer 18 is deposited on the entire resultant structure. Therefore, the first metal layer 18 is formed on an upper surface of the first oxide layer 17, a sidewall of the hole 17a, and the upper surface of the polysilicon layer 15 exposed in the hole 17a. That is, the first metal layer 18 is downwardly extended in the hole 17a and electrically connected to the polysilicon layer 15, thereby acting as the floating gate. The first metal layer 18 is formed to a thickness of several tens angstrom (Å) by well-known physical vapor deposition (PVD) process such as sputtering or CVD employing plasma.

Figure 3G:
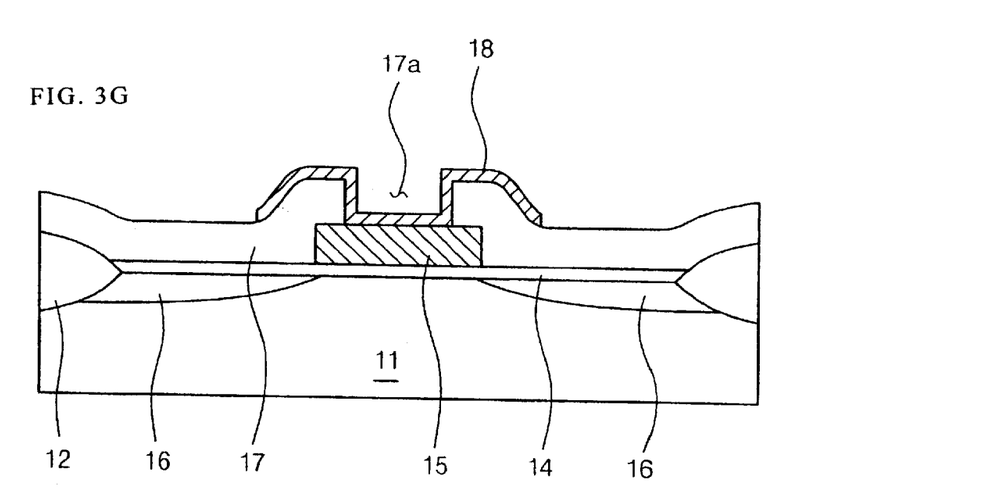

Next, as shown in FIG. 3G, the first metal layer 18 is patterned in a predetermined pattern by using photolithography and subsequent dry etching process.

Commonly, the conventional method for forming the polysilicon layer needs processes for depositing undoped polysilicon, implanting ion impurities, and etching back. Furthermore, a cleaning process is further required for removing a natural oxide layer. In addition, the process of ion implantation is performed in several steps (generally four steps) to prevent undesirable shadow effect due to tilt ion implantation. Therefore, the conventional method becomes complicated. Contrary to that, the method according to the present invention is relatively simpler since the metal layer is formed by depositing aluminum in a sputtering or plasma CVD process and then etching the deposited aluminum in a reactive ion etching (RIE) process.

Figure 3H:
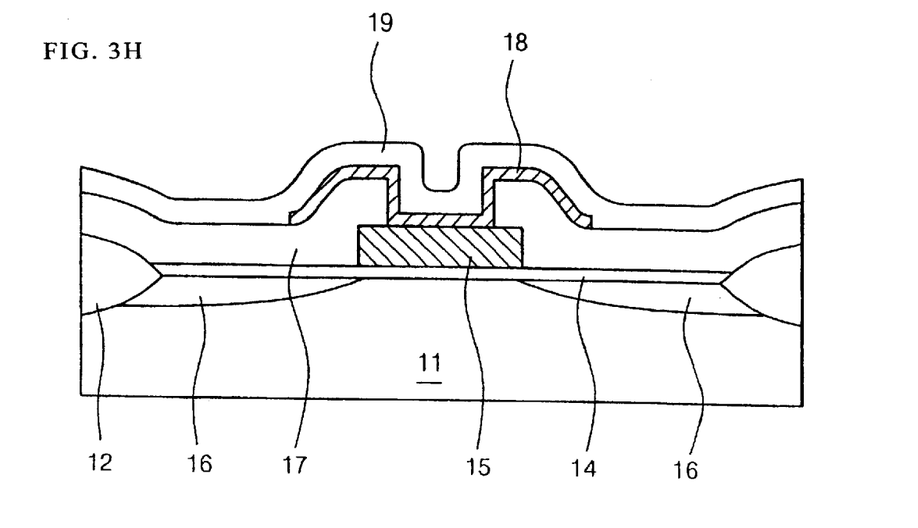

Now referring to FIG. 3H, the second oxide layer 19 is then deposited on the entire resultant structure. Therefore, the second oxide layer 19 is formed to cover the patterned first metal layer 18 and an exposed upper surface of the first oxide layer 17. The second oxide layer 19 has a downwardly extended portion similar to that of the first metal layer 18. The second oxide layer 17 is formed to a thickness of several hundreds angstrom (Å) by using well-known CVD process.

Figure 3I:
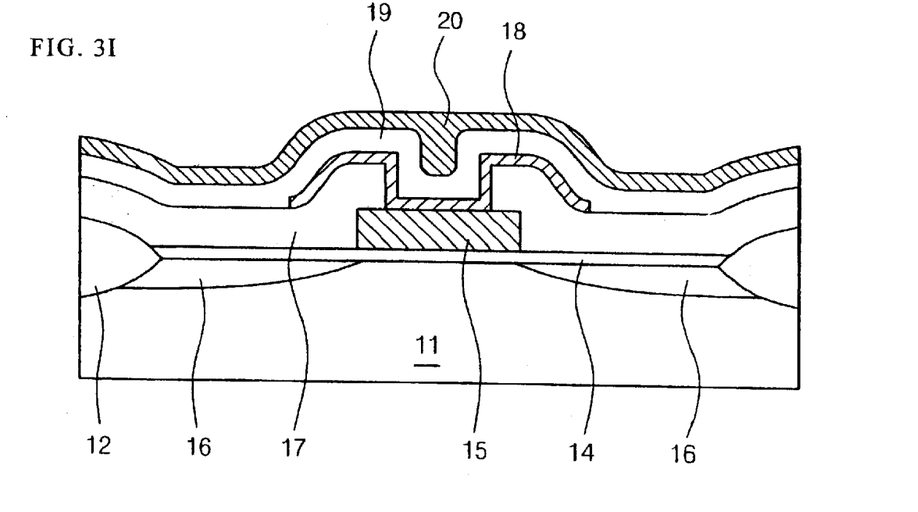
Figure 3J:
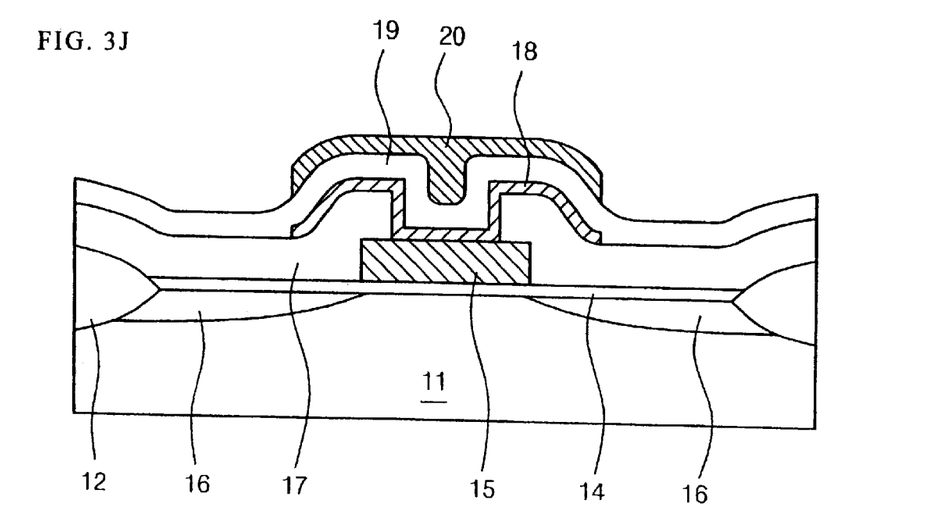

Next, as shown in FIG. 3I, the second metal layer 20 is deposited on an upper surface of the second oxide layer 19 and then, as shown in FIG. 3J, patterned in a predetermined pattern. Therefore, the second metal layer 20 is electrically isolated from the first metal layer 18 by the second oxide layer 19 and also operates as the control gate. In particular, a lower surface of the second metal layer 20 has a downwardly extended portion. The second metal layer 20 is formed to a thickness of several tens angstrom (Å) by well-known PVD or plasma CVD process and then patterned by photolithography and subsequent dry etching process. Preferably, the same mask is employed for process of patterning the first and second metal layers 18 and 20.

Figure 3K:
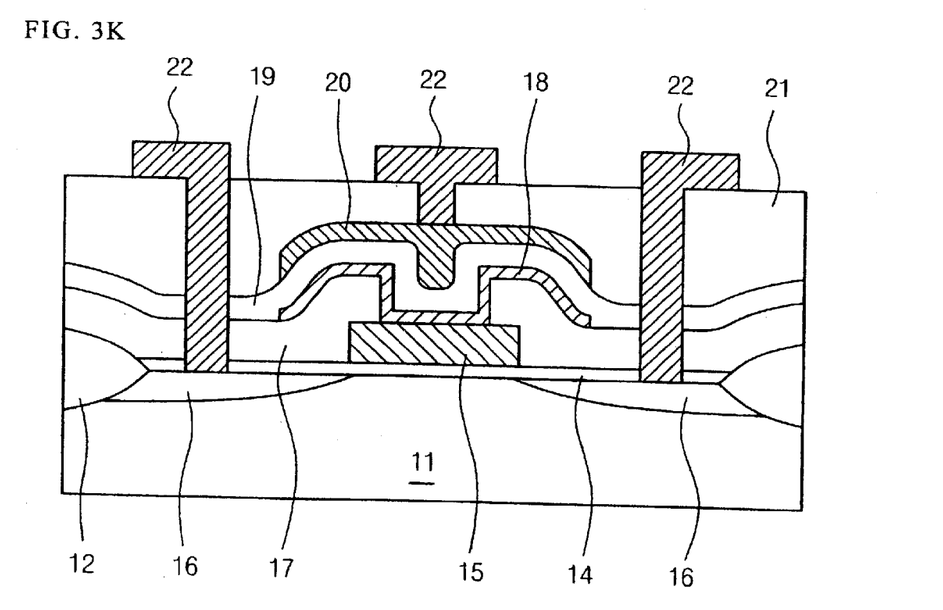

Thereafter, referring to FIG. 3K, the interlayer dielectric layer 21 such as boro-phosphorus silicate glass (BPSG) is formed on the entire resultant structure by well-known process. Contact holes are then formed in the interlayer dielectric layer 21 in order to expose parts of the second metal layer 20 and the source/drain regions 16. The contact holes are then filled with metal to form the metal lines 22.

As described above, according to the present invention, confronting surfaces of the metal layers, used respectively as the floating gate and the control gate, have a downwardly extended portion. Therefore, the surface area per fixed unit cell area and resultant coupling ratio are increased, respectively, and thereby the programming/erasing properties are improved. Additionally, the unit cell area can be reduced enough to realize high integration of the device, and also the over-erase phenomenon can be improved.

Furthermore, since the fabrication method of the present invention adopts a way of forming the floating gate and the control gate by using the metal layer, processes are simplified and production cost is reduced.

In the drawings and specification, there have been disclosed typical preferred embodiments of the invention. Although specific terms are employed, they are used in a generic and descriptive sense only and not for purposes of limitation, the scope of the invention being set forth in the following claims.

What is claimed is:

1. A method for fabricating a nonvolatile memory device, comprising:

providing a semiconductor substrate having an active area defined by an isolation layer;

forming a gate oxide layer on the active area of the semiconductor substrate;

forming a polysilicon layer acting as a floating gate on a part of the gate oxide layer;

forming source and drain regions in the active area of the semiconductor substrate from both sides of the polysilicon layer;

forming a first oxide layer on the gate oxide layer around the polysilicon layer and on a peripheral part of the polysilicon layer;

forming a first metal layer on a part of the first oxide layer and on a central part of the polysilicon layer exposed through the first oxide layer, whereby the first metal layer has a downwardly extended portion electrically connected to the polysilicon layer and thus acts as the floating gate;

forming conformally a second oxide layer on the first metal layer and the first oxide layer;

forming a second metal layer acting as a control gate on a part of the second oxide layer to correspond to the first metal layer, so that the second metal layer has a downwardly extended portion; and forming metal lines respectively connected to the second metal layer and the source/drain regions.

2. The method of claim 1, further comprising:

implanting ions into a top surface of the semiconductor substrate in order to control a threshold voltage before the forming of the gate oxide layer.

3. The method of claim 2, further comprising:

forming a sacrificial oxide layer on the top surface of the semiconductor substrate before the implanting of the ions, and removing the sacrificial oxide layer after the implanting of the ions.

4. The method of claim 1, wherein the forming of the first oxide layer includes depositing the first oxide layer on the gate oxide layer and the polysilicon layer, and forming a hole in the first oxide layer to expose the central part of the polysilicon layer.

5. The method of claim 1, wherein the forming of the first metal layer includes depositing the first metal layer on the first oxide layer and the polysilicon layer, and patterning the first metal layer.

6. The method of claim 5, wherein the depositing of the first metal layer is performed by means of sputtering or chemical vapor deposition (CVD) using plasma.

7. The method of claim 5, wherein the patterning of the first metal layer is performed by means of reactive ion etching (RIE).

8. The method of claim 1, wherein the forming of the second metal layer includes depositing the second metal layer on the second oxide layer, and patterning the second metal layer.

9. The method of claim 8, wherein the depositing of the second metal layer is performed by means of sputtering or chemical vapor deposition (CVD) using plasma.

10. The method of claim 8, wherein the patterning of the second metal layer is performed by means of reactive ion etching (RIE).

11. The method of claim 1, further comprising:

forming an interlayer dielectric layer on a resultant structure before the forming of the metal lines, and forming contact holes in the interlayer dielectric layer so that parts of the second metal layer and the source and drain regions are exposed respectively.

* * * * *